United States Patent [19]

Anthony et al.

[11] 4,178,192

[45] Dec. 11, 1979

[54] PROMOTION OF SURFACE FILM STABILITY DURING INITIATION OF THERMAL MIGRATION

[75] Inventors: Thomas R. Anthony; Harvey E. Cline, both of Schenectady, N.Y.

[73] Assignee: General Electric Company, Schenectady, N.Y.

[21] Appl. No.: 941,924

[22] Filed: Sep. 13, 1978

[51] Int. Cl.² .......................................... H01L 21/225
[52] U.S. Cl. .................................... 148/1.5; 148/178; 148/188
[58] Field of Search .......................... 148/1.5, 178, 188

[56] References Cited

U.S. PATENT DOCUMENTS

| | | | |
|---|---|---|---|
| 3,897,277 | 7/1975 | Blumenfeld | 148/186 X |
| 3,899,362 | 8/1975 | Cline et al. | 148/179 X |
| 3,988,766 | 10/1976 | Anthony et al. | 148/1.5 X |
| 3,998,662 | 12/1976 | Anthony et al. | 148/171 X |
| 3,998,675 | 12/1976 | Langheinrich et al. | 148/187 X |
| 4,001,047 | 1/1977 | Boah | 148/1.5 |
| 4,076,559 | 2/1978 | Chang et al. | 148/188 X |

*Primary Examiner*—G. Ozaki
*Attorney, Agent, or Firm*—Donald M. Winegar; Joseph T. Cohen; Leo I. MaLossi

[57] ABSTRACT

Titanium, aluminum, lithium, magnesium and calcium are metal wetting agents which are capable of reducing the oxide of a semiconductor material naturally occurring, deposited or grown on a body of the semiconductor material and increasing the solubility of oxygen in gold, silver and tin.

9 Claims, No Drawings

PROMOTION OF SURFACE FILM STABILITY DURING INITIATION OF THERMAL MIGRATION

BACKGROUND OF THE INVENTION

Field of the Invention

This invention relates to a method of migrating a melt of a metal through a solid body of semiconductor material by thermal gradient zone melting (TGZM) and, in particular, to a method for reducing silicon oxide and for increasing the solubility of oxygen in gold, silver and tin.

Some of the metals which are desirable for doping silicon for achieving particular electrical properties are not ideal metals for practicing thermal gradient zone melting processing of silicon wafers. Such metals are gold, silver and tin. These three metals do not wet silicon in air or in an argon atmosphere.

The inability of gold, silver and tin to wet silicon in an air or an argon atmosphere leads to the spontaneous breakup of the molten wire and grid structures comprising these materials during initiation of melting the deposited metal to form the melt to be migrated during the penetration stage of thermal migration.

It appears that the reason why gold, silver and tin do not wet silicon is because of the presence of a thin layer of silicon oxide on the silicon surface that was generated during wafer processing in air. Since neither tin, gold nor silver can reduce silicon oxide, the silicon oxide layer persists under the deposited layers of these metals. Because these metals will not wet the silicon oxide, they tend to ball up on the wafer surface and thus cause breakup of the wire, or line, and grid structure.

Gold, silver and tin are important metals for imparting lifetime control and N-type conductivity to silicon wafers.

BRIEF DESCRIPTION OF THE INVENTION

In accordance with the teachings of this invention there is provided an improved method for moving a melt of metal-rich semiconductor material through a solid body of the semiconductor material by thermal gradient zone melting. The improvement consists of including a wetting agent in the melt of metal-rich semiconductor material. The wetting agent is utilized to attack the semiconductor oxide layer either naturally occurring, or grown on, the surface of the body of semiconductor material at which initiation of the thermal migration is to occur.

When the semiconductor material is silicon, the oxide layer is silicon oxide. The amount of wetting material present is equivalent to that required to make a layer of wetting material of a thickness of from at least the same as, or up to twice, the thickness of the layer of silicon oxide.

The wetting agents are preferably vapor deposited and should contain as little trapped oxygen therein as possible.

DESCRIPTION OF THE INVENTION

A body of semiconductor material is selected for a particular level of resistivity and a first type conductivity. The body has opposed major surfaces which are the top and bottom surfaces, respectively, thereof. The semiconductor material comprising the body may be silicon, silicon carbide, germanium, gallium arsenide, a compound of a Group II element and a Group VI element, and a compound of a Group III and a Group V element.

The thermal migration of metal wires is preferably practiced in accordance with the planar orientations, thermal migration directions, stable wire directions and stable wire sizes of the Table.

Table

| Wafer Plane | Migration Direction | Stable Wire Directions | Stable Wire Sizes |
|---|---|---|---|
| (100) | <100> | <011>* | <100 microns |
|  |  | <0$\bar{1}$1>* | <100 microns |
| (100) | <110> | <1$\bar{1}$0>* | <150 microns |
| (111) | <111> | (a) <01$\bar{1}$> |  |
|  |  | <10$\bar{1}$> | <500 microns |
|  |  | <1$\bar{1}$0> |  |
|  |  | (b) <11$\bar{2}$>* |  |
|  |  | <$\bar{2}$11>* | <500 microns |
|  |  | <1$\bar{2}$1>* |  |
|  |  | (c) Any other* direction in (111) plane. | <500 microns |

*The stability of migrating wire is sensitive to the alignment of the thermal gradient with the <100>, <110> and <111> axis, respectively.
*Group a is more stable than group b which is more stable than group c.

Droplets are migrated in the migration direction. The shape of the droplet is determined by the wafer plane orientation and migration direction. In a crystal axis direction of <111> of thermal migration, the droplet migrates as a triangular platelet laying in a (111) plane. A droplet migrates in the <100> crystal axis direction as a regular pyramid bounded by four forward (111) planes and a rear (100) plane. Alternately, the droplet may have a triangular shape.

A droplet migrates in the <100> crystal axis direction as an irregular pyramid with a diamond base.

The temperature gradient zone melting process and apparatus is not a part of this invention. For a more thorough understanding of the temperature gradient zone melting process employed in this invention and for a more thorough description of the apparatus employed for this process, one is directed to the following U.S. Pats. entitled Method of Making Deep Diodes, No. 3,901,736; Deep Diode Device and Method, U.S. Pat. No. 3,902,925; Deep Diode Devices and Method and Apparatus, No. 4,091,257; High Velocity Thermomigration Method of Making Deep Diodes, U.S. Pat. No. 3,898,106; Deep Diode Device and Method, U.S. Pat. No. 3,902,925; The Stabilized Droplet Method of Making Deep Diodes Having Uniform Electrical Properties, U.S. Pat. No. 3,899,361; Method of Making Isolation Grids in Bodies of Semiconductor Material, U.S. Pat. No. 3,979,230; and Thermomigration of Metal-Rich Liquid Wires Through Semiconductor Materials, U.S. Pat. No. 3,899,962.

The surface of the body of semiconductor material is prepared by usual semiconductor processing techniques for deposition of the metal to be migrated through the solid body of material. The metal consists of two elements, one element is from the group consisting of gold, silver and tin. The second element is selected from the group consisting of titanium, aluminum, lithium, magnesium and calcium. The first elements are used to control the lifetime of the semiconductor material. The second elements are employed as a wetting agent. Such a wetting agent, particularly the ones noted heretofore, must be capable of reducing the layer of oxide of the semiconductor material and also be capable of increasing the solubility of oxygen in the gold, silver or tin. The oxide layer may be either naturally occurring, deposited and/or grown for a specific purpose on the surface.

In order to describe the invention more fully, and for no other reason, the semiconductor material is said to be silicon and the oxide layer is silicon oxide.

The amount of wetting agent required is dependent upon its silicon oxide wettability property and its affect on the doping level concentration of the semiconductor material (lifetime). The rule of thumb requirement is that the layer of wetting agent should be at least equal to, and can be as up to twice the thickness of the silicon oxide.

The wetting agent metal is deposited on the surface of preferred planar crystal orientation and surface of initiation. Preferably, the wetting agent material is deposited by suitable vapor deposition means which restricts any oxygen content of the vapor deposited metal to a bare minimum. The wetting agent is preferably deposited first on the surface so as to be able to directly attack the silicon oxide film. Then the principal metal element or elements to be migrated are then vapor deposited on top of the wetting element. A codeposition technique could be used, or the use of a master alloy of the wetting element and the principal element or elements could also be relied upon for depositing the metal elements to be thermally migrated. However, one may encounter some difficulty in wetting particularly when the wetting agent is present only in trace amounts.

Aluminum has the best solubility capability and most desirable lifetime consideration of all the wetting elements. Aluminum can be added in trace amounts, as small as one-tenth part per million in an infinite melt of tin, silver or gold to reduce an underlying silicon oxide film. However, since there is a limited volume of deposited layer of tin, gold, or silver, and since a sufficient volume of aluminum must be available in the deposited layer as well to reduce the silicon oxide layer, the P-type doping characteristics of aluminum become important. 100Å of aluminum is required to reduce a silicon oxide layer of 100Å thickness. In a gold, tin or silver deposited layer of 10 microns thickness, the alloy composition is one part in one thousand of aluminum, balance gold, tin or silver. After thermal migration, the silicon semiconductor material is doped P-type and the aluminum impurity concentration level is $1/1000 \times 2 \times 10^{19}$ atoms per cubic centimeter because of the aluminum wetting agent present. Therefore, if one should desire to recrystallize semiconductor material produced by the temperature gradient zone melting process to be N-type conductivity, a suitable N-type doping material such, for example, as antimony must be present in the alloy droplet or metal layer constituents. The amount of N-type doping material must be sufficient to dope the recrystallized semiconductor material to a concentration greater than $2 \times 10^{16}$ atoms per cubic centimeter.

The importance of the oxgen content in the deposited metal to be migrated in demonstrated by the effect of oxygen on the aluminum wetting agent itself. It has been discovered that the vapor deposition of the layer of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal vapor deposited, the aluminum does not easily penetrate into the silicon and migrate through the body. It is believed that the layer of aluminum is saturated with oxygen and prevents reduction by the aluminum metal of the very thin silicon oxide layer between the deposited aluminum and the silicon. Thus, the initial melt of aluminum and silicon required for migration is not obtained because of the inability of the aluminum layer to wet and alloy with the underlaying silicon. In a similar manner, the aluminum deposited by sputtering is not as desirable as sputtered aluminum appears to be saturated with oxygen from the sputtering process, thereby preventing the reduction of any intervening silicon oxide. The preferred methods of depositing aluminum on the silicon body are by the electron beam method and the like wherein little, if any, oxygen can be trapped in the aluminum.

We claim as our invention:

1. In the method of moving a melt of metal-rich semiconductor material through a solid body of semiconductor material by thermal gradient zone melting processing comprising the steps of
   a. selecting a body of single crystal semiconductor material so that the body has a first type conductivity, a selected resistivity, and at least one major surface having a preferred planar crystal structure orientation which is one selected from the group consisting of (100), (110) and (111), the vertical axis of the body being substantially aligned with a first axis of the crystal structure;
   b. depositing a layer of metal having the preferred planar crystal structure orientation of one or more physical configurations on the selected surface of the body of semiconductor material;
   c. heating the body and the metal deposit to a temperature sufficient to form a melt of metal-rich material on the surface of the body;
   d. establishing a unidirectional temperature gradient along substantially the vertical axis of the body and the first axis of the crystal structure; and
   e. migrating the metal-rich melt though the body along the unidirectional temperature gradient to divide the body into a plurality of regions of first type conductivity and to form at least one array of regions of recrystallized material of the body having solid solubility of the vapor deposited metal therein, the metal including at least one impurity material therein to impart at least one predetermined electrical characteristic thereto;
   the improvement in the method of processing which includes
   incorporating a wetting agent in the deposited layer of metal to enhance the wettability of the deposited layer with respect to a layer of the oxide of the semiconductor material on the surface of the body on which the metal is deposited and to promote initiation of thermal migration of a melt of the metal of the layer through the body by thermal gradient zone melting processing.

2. The method of claim 1 wherein the depositing of the metal layer includes
   (aa) depositing a first layer of wetting agent material directly onto the surface of the body and any layer of oxide of the semiconductor material present thereat, and
   (ab) depositing on the first layer of wetting agent material a second layer of the material to effect the desired electrical characteristics in the body.

3. The method of either claim 1 or 2 wherein the layer of metal is vapor deposited.

4. The method of claim 3 wherein the layer of metal is substantially free of oxygen.

5. The method of either claim 1 or 2 wherein
the semiconductor material is silicon, and
the wetting agent is a material selected from the group consisting of aluminum, titanium, lithium, magnesium and calcium.

6. The method of claim 5 wherein
the layer of metal to be migrated includes a material which is one selected from the group consisting of tin, gold and silver.

7. The method of either claim 1 or 2 wherein
the semiconductor material is silicon, and
the wetting agent is aluminum.

8. The method of claim 1 wherein
the semiconductor material is silicon,
the metal layer is vapor deposited and substantially free of oxygen,
the wetting agent is a material selected from the group consisting of aluminum, titanium, lithium, magnesium, and calcium, and
the amount of wetting agent present is equivalent to that required to make a layer of the same equivalent thickness as the thickness of the semiconductor oxide layer upon which it is deposited.

9. The method of claim 8 wherein
the equivalent thickness of the amount of wetting agent present is no greater than twice the thickness of the silicon oxide present.

* * * * *